(12) United States Patent
Wang et al.

(10) Patent No.: US 6,534,799 B1
(45) Date of Patent: Mar. 18, 2003

(54) SURFACE MOUNT LIGHT EMITTING DIODE PACKAGE

(75) Inventors: Bily Wang, Hsin-Chu (TW); Bill Chang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 121 days.

(21) Appl. No.: 09/678,373

(22) Filed: Oct. 3, 2000

(51) Int. Cl.[7] .............................................. H01L 33/00
(52) U.S. Cl. ........................................ 257/99; 257/100
(58) Field of Search .............................. 257/88, 91, 99, 257/100; 362/800

(56) References Cited

U.S. PATENT DOCUMENTS

RE36,614 E  *  3/2000  Lumbard et al. ............ 313/500
6,383,835 B1 *  5/2002  Hata et al. .................... 257/433

* cited by examiner

Primary Examiner—Minh Loan Tran
(74) Attorney, Agent, or Firm—H. C. Lin Patent Agent

(57) ABSTRACT

In a surface mount LED chips mounted on an insulating substrate, plated through conduits to interconnect the chips on both sides are placed at the corners of the outer terminals at two horizontal ends. The depressions caused by wire-bonding the chip to the terminals are lined up vertically with the corner conduits to reduce horizontal dimension.

9 Claims, 7 Drawing Sheets

SURFACE MOUNT LIGHT EMITTING DIODE PACKAGE

BACKGROUND OF THE INVENTION

(1) Field of the Invention

This invention relates to semiconductor device package, particularly to surface mount light emitting diode (LED) package.

(2) Brief Description of the Related Art

In semiconductor technology, surface mount packages are sometimes used to hold one semiconductor chip on front side of a substrate and contact to a mother board is made on backside of the substrate. FIG. 1 shows a prior art package for mounting a LED chip on one side of a substrate 13. The package has two metal terminals 11 and 12 for external connection. The metal terminal 11 is an extension of a landing on which a semiconductor chip 10 is mounted. In the backside of the substrate, there are corresponding metal terminals. The terminals 11,12 are connected to a corresponding terminals in the back through a semicircular plated through conduit 151 and 152.

The chip 10 has two electrodes 101 and 102 connected by wires 103 and 104 respectively to the terminals 11 and 12. The wires 103, 104 are compressed on the terminals 11 and 12 respectively for bonding. The compression creates an expanded compressed area 16. This compressed area occupies a width d1. The semicircular conduit occupies a width d2. The chip requires a width d3 for mounting. Thus the total width W1 is equal the total of d1, d2 and d3, i.e. W1=2d1+2d2+d3.

For low cost production, it is important to reduce the size of the package. For a display panel composed of a large number of the LEDs, a closer packaging can increase the light intensity and higher resolution. Therefore, a smaller LED package is what the industry is striving for.

SUMMARY OF THE INVENTION

An object of this invention is to reduce the package of a surface mount semiconductor package. Another object of this invention is to reduce the dimension of LED package. Still another object of this invention is to increase the light intensity and resolution of an LED display panel.

These objects are achievement by placing the plated-through conduits at the corners of the package, so that the expanded compressed area is offset from and lined up vertically with the conduit, thus reducing the total horizontal width of the package.

DETAILED DESCRIPTION OF THE INVENTION

Figure 1:
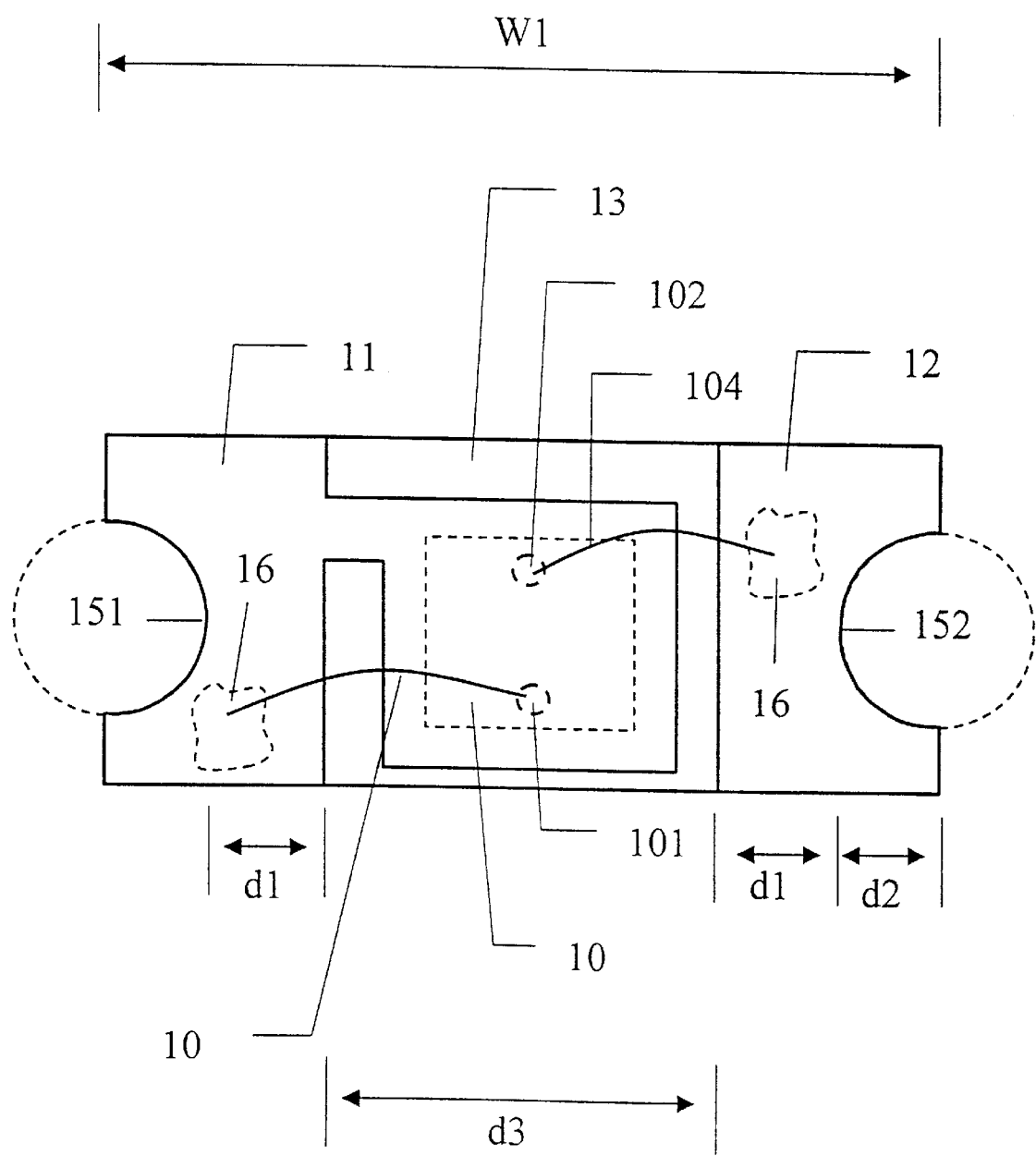
FIG. 1 shows the prior art layout of a surface mount LED package.
Figure 2:
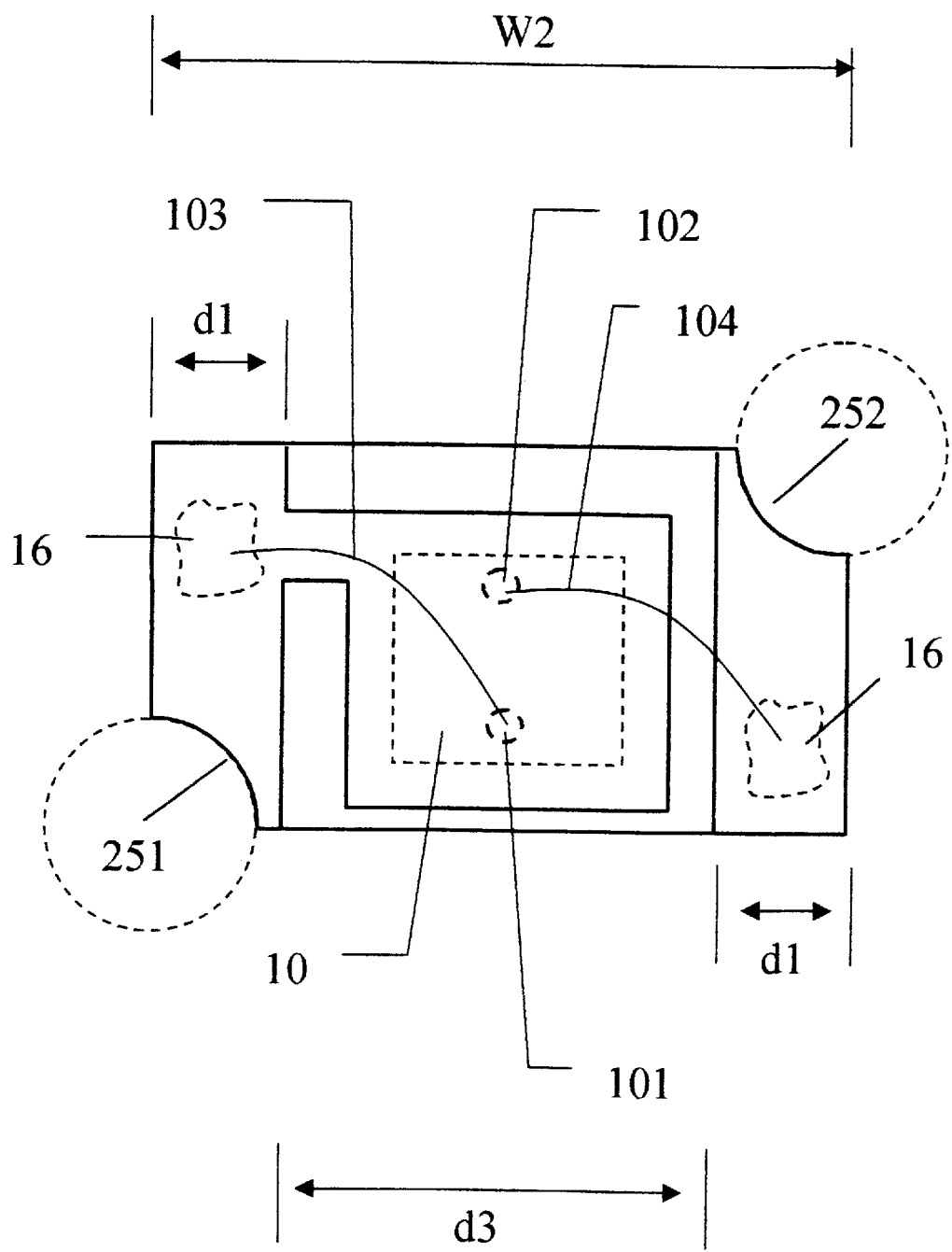
FIG. 2 shows the layout of a surface LED package based on the present invention.

FIG. 2 shows the layout of the package for a surface mount LED substrate of the present invention. The package has two metallic terminals 11, 12 at the front side. The terminal 11 is an extension of a landing for mounting a LED chip 10. The terminal 11 has an arc-shaped cut at the corner to form a plated-through conduit 251 for connecting to a contact surface on the backside of the substrate. The terminal 12 has an arc-shaped cut at the corner to form a plated-through conduit 252 for connecting to a contact surface on the backside of the substrate 13. The chip has two electrodes 101 and 102. The electrode 101 is connected to the terminal 11 by a wire 103, which is compressed on the terminal 11. The compression creates an expanded compressed area 16. The electrode 102 is connected to the terminal 12 by a wire 104, which is compressed on terminal 12. The compression creates another expanded compressed area 16. Since the conduit 251 and the expanded compressed area 16 are aligned in the vertical direction, the width d1 can accommodate both the conduit 251 and the expanded compressed area 16. Thus the width d2 in the prior art FIG. 1 is eliminated. The total width W2 is equal to 2d1 plus d3, the width for mounting the chip 10, and is reduced by a width 2d2 as compared to prior art.

Figure 3:
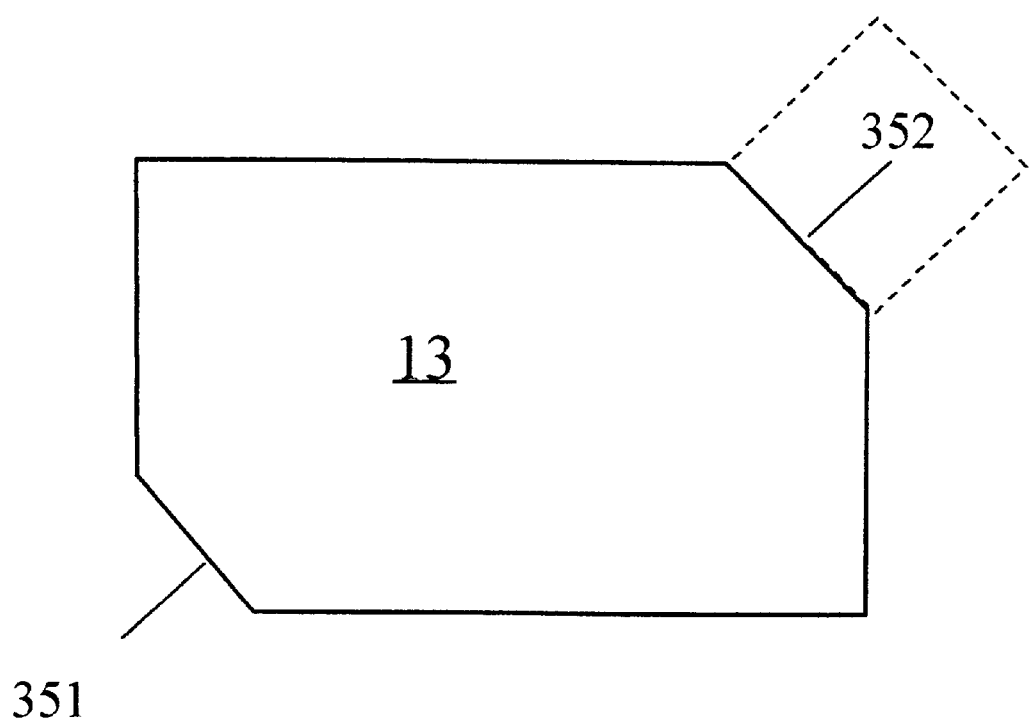
FIG. 3 shows rhombic plated through conduit.

The conduit in FIG. 2 is not limited to arc-shaped. Rhombic plated through conduits 351 and 352 as shown in FIG. 3 may also be used to connect both sides of the substrate 13.

Figure 4:
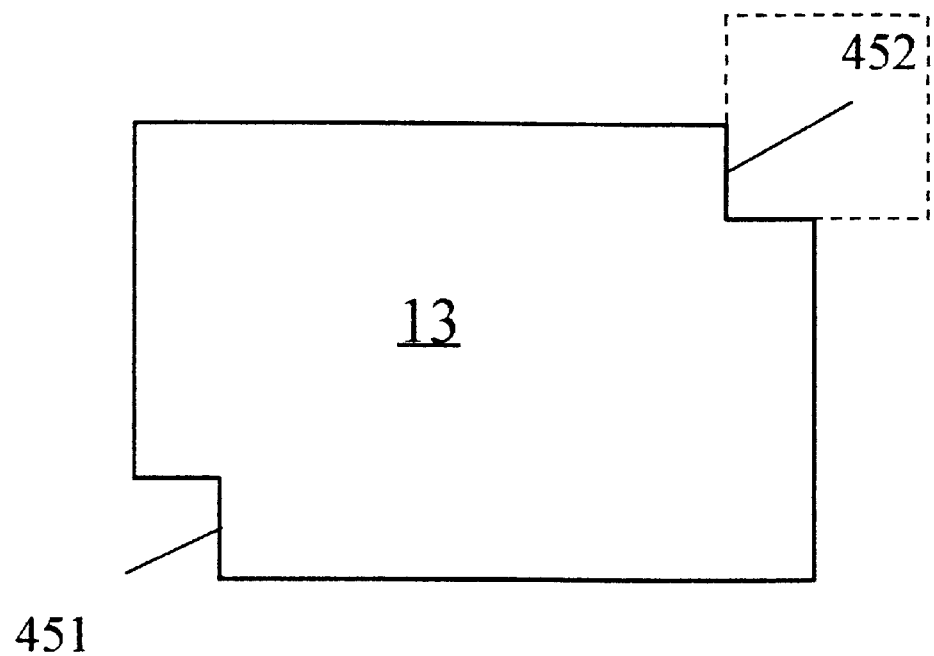
FIG. 4 shows a rectangular plated-through conduit.

FIG. 4 shows rectangular plated through conduits 451 and 452 for connecting the chips on both side of the substrate 13.

Figure 5:
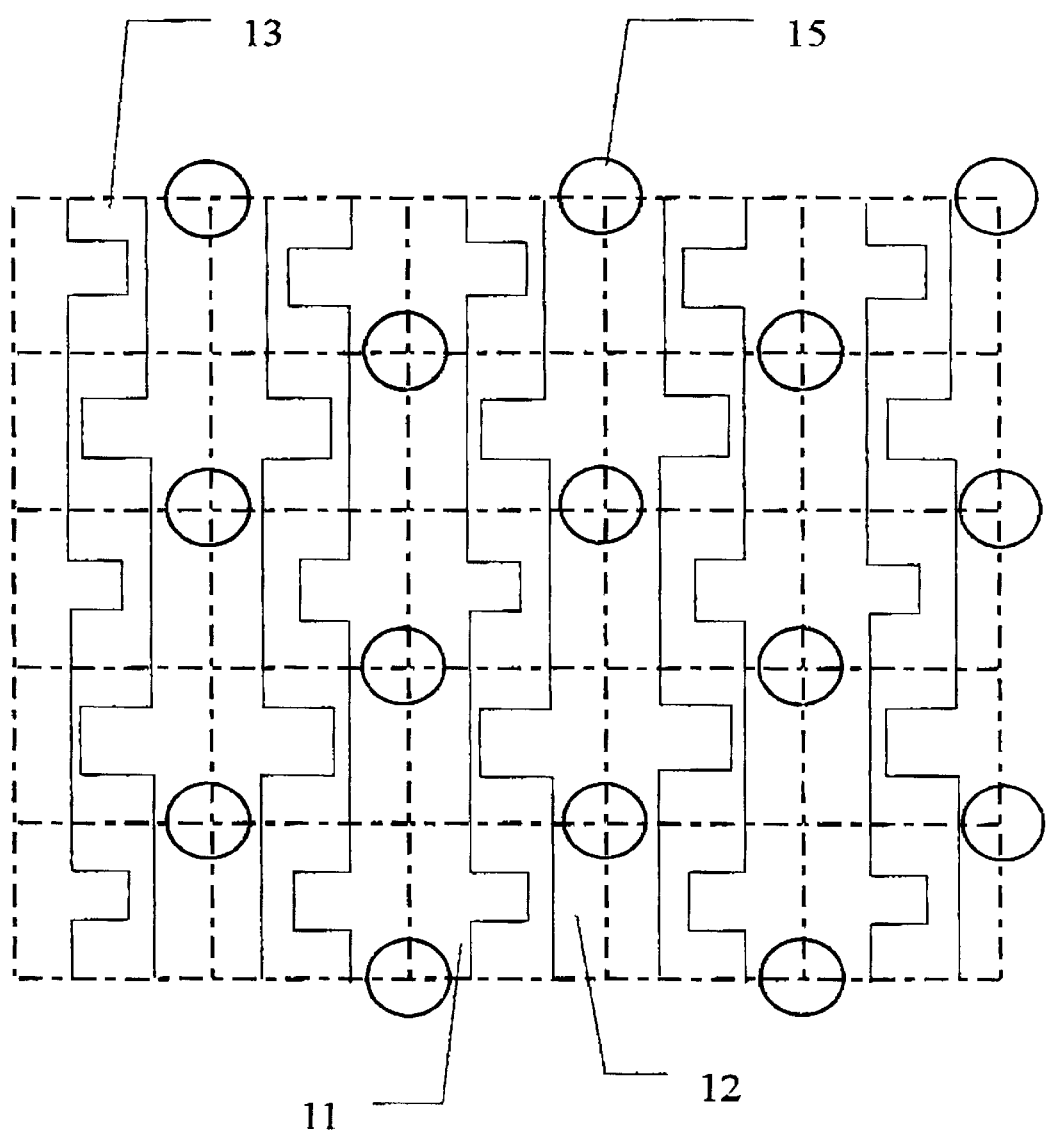
FIG. 5 shows an arrangement for packaging an array of LED packages in a display panel or for mass production.

FIG. 5 shows an array of LED packages pieced together to form a display panel. Note that each conduit 15 connects four packages together. The individual packages are pieced together back-to-back in the horizontal direction. In the vertical direction, the terminal 11 and the terminal 12 are alternately pieced together. After wire bonding the individual chips, the entire structure can be sealed in glue (not shown) to improve reliability. To prevent the glue from seeping through to the opposite side, the plated through conduits can be sealed first by sealing compound before being sealed by the glue. The panel may also be used as a means for mass production. For mass production, the array may be sawed along the dot-dash lines.

For mass production of the packages, the fabrication steps may be as follows:

Step 1: Preparing a common substrate 13 with conductive metal layers on both sides;

Step 2: Forming metal wall conduits 15 on said substrate;

Step 3: Plating the conduits with metal for connecting the two sides;

Step 4: Forming the first terminal 11 on one end and the second terminal 12 at the other end, and forming a third metal terminal at the first end of the backside of the substrate and fourth metal terminal at the second end of the substrate, Step 5: Placing the chips 10 on the front side of the substrate, Step 6: Wire bonding the first electrode 101 of the chip 10 to the first terminal 11;

Step 7: Wire-bonding the second electrode 102 of the chip 10 to the second terminal 12;

Step 8: Sawing the common 13 horizontally and vertically to yield individual chips.

If necessary, a step 9 to seal the package may be added to improve the reliability.

If still necessary, another step may be added before step 5 to seal the conduit before the mounting of the chip to prevent the glue from seeping into the conduit to adversely affect soldering.

If further necessary, another step may be added before step 8 to remove the sealing compound.

Figure 6:
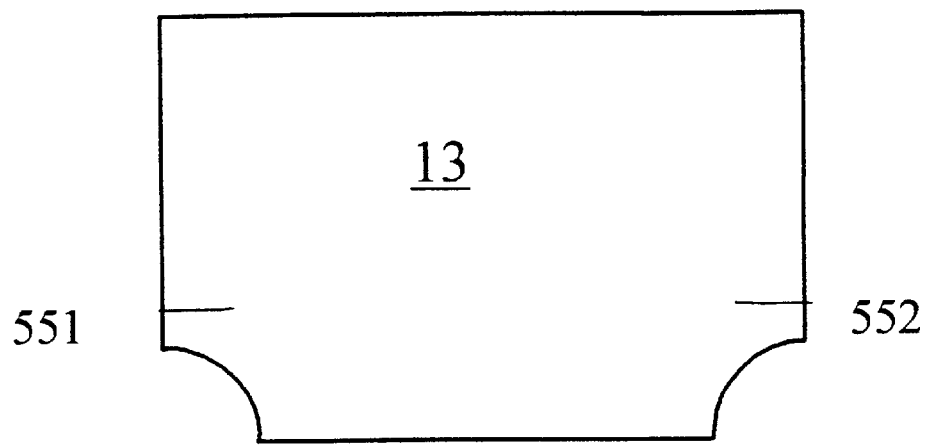
FIG. 6 shows another embodiment of the substrate with corner cut at the same side.
Figure 7:
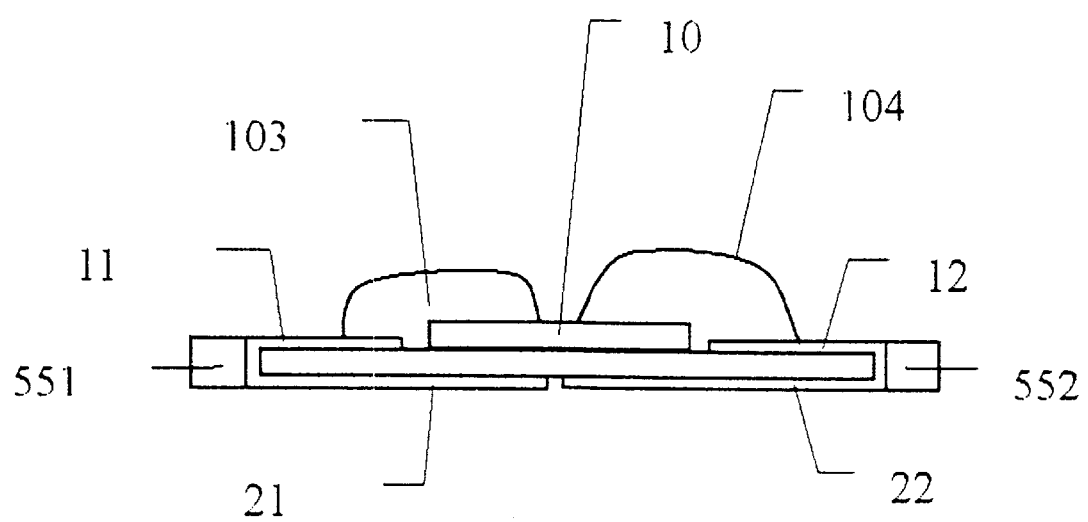
FIG. 7 shows the side view of the package using the substrate shown in FIG. 6.

While the embodiment shown in FIGS. 2–4 describes corner conduits placed diagonally, it is also possible to place the corner conduits at the same side of the substrate as shown in FIG. 6. FIG. 7 shows a cross-sectional side view of a wired package for the substrate shown in FIG. 6. The reference numerals correspond to that in FIG. 2

While the preferred embodiments of the invention have been described, it will be apparent to those skilled in the art that various modifications may be made in the embodiments without departing from the spirit of the present invention. Such modifications are all within the scope of this invention.

We claim:

1. A surface mount package for LED with double-sided terminals, comprising:
   a rectangular insulating substrate having a front side and a back side;
   an LED chip having a first electrode and a second electrode, and mounted on said front side of said substrate;
   a first metallic terminal on said front side at first end of said rectangular insulating substrate;
   a second metallic terminal on said front side at second end of said rectangular insulating substrate
   a third metallic terminal on said back side at first end of said rectangular insulating substrate;
   a fourth metallic terminal on said back side at second end of said rectangular insulating substrate;
   a first wire connected to said first electrode at one end and bonded to said first metallic terminal at a second end;
   a second wire connected to said second electrode at one end and bonded to said second terminal at a second end;
   a first metal wall at a corner of said first end of said rectangular insulating substrate for connecting said first metallic terminal to said third metallic terminal; and
   a second metal wall at the corner of said second end of said rectangular insulating substrate for connecting said second metallic terminal to said fourth metallic terminal.

2. The surface mount package as described in claim 1, wherein the second metal wall is diagonal to said first metal wall.

3. The surface mount package as described in claim 1, wherein said first metal wall and said second metal wall are of arc shape.

4. The surface mount r package as described in claim 1, wherein said first metal wall and said second metal wall are of rhombic shape.

5. The surface mount package as described in claim 1, wherein said first metal wall and said second metal wall are of rectangular shape.

6. The surface mount package as described in claim 1, further comprising a large number of said packages to form an array of packages.

7. The surface mount package as described in claim 6, wherein said array is sawed to yield a large number of individual said package.

8. The surface mount package as described in claim 7, wherein said array is covered with glue.

9. The surface mount package as described in claim 6, further comprising a large number of said package to from an array of packages as a display panel.

* * * * *